(12) United States Patent
Lai

(10) Patent No.: US 12,153,089 B2
(45) Date of Patent: Nov. 26, 2024

(54) ELECTRONIC DEVICE FOR SELF-TESTING PERIOD OF CLOCK SIGNAL AND MONITORING METHOD THEREOF

(71) Applicant: Richtek Technology Corporation, Zhubei (TW)

(72) Inventor: Fu-Shiang Lai, Taichung (TW)

(73) Assignee: RICHTEK TECHNOLOGY CORPORATION, Zhubei (TW)

( * ) Notice: Subject to any disclaimer, the term of this patent is extended or adjusted under 35 U.S.C. 154(b) by 155 days.

(21) Appl. No.: 18/165,490

(22) Filed: Feb. 7, 2023

(65) Prior Publication Data

US 2024/0069097 A1 Feb. 29, 2024

(30) Foreign Application Priority Data

Aug. 24, 2022 (TW) .................................. 111131863

(51) Int. Cl.
*G01R 31/317* (2006.01)

(52) U.S. Cl.
CPC . *G01R 31/31727* (2013.01); *G01R 31/31724* (2013.01)

(58) Field of Classification Search
CPC ........ G01R 31/31727; G01R 31/31724; H03K 5/19; H03K 5/135
USPC ....................................................... 714/744
See application file for complete search history.

(56) References Cited

U.S. PATENT DOCUMENTS

| | | |
|---|---|---|
| 5,034,624 A | 7/1991 | Flaherty |
| 6,597,749 B1 | 7/2003 | Bracmard |
| 7,577,231 B2 * | 8/2009 | Pomichter, Jr. ........... G06F 1/08 327/116 |
| 9,887,691 B2 | 2/2018 | Park |
| 10,090,994 B2 | 10/2018 | Tsai |
| 10,164,572 B2 | 12/2018 | Chen |
| 2004/0100312 A1 * | 5/2004 | Cho ...................... H03L 7/0816 327/158 |
| 2008/0157860 A1 * | 7/2008 | Kim ........................ G11C 5/147 327/543 |
| 2009/0146703 A1 * | 6/2009 | Suda ...................... H03L 7/083 327/156 |
| 2010/0171558 A1 * | 7/2010 | Kim ...................... H03K 3/0322 331/57 |
| 2010/0327846 A1 * | 12/2010 | Okamoto ............. H03H 11/245 323/369 |
| 2012/0154057 A1 * | 6/2012 | Kim ...................... H03K 4/501 331/25 |

(Continued)

FOREIGN PATENT DOCUMENTS

CN 106469568 B 2/2021

*Primary Examiner* — Albert Decady
*Assistant Examiner* — Osman M Alshack
(74) *Attorney, Agent, or Firm* — McClure, Qualey & Rodack, LLP

(57) ABSTRACT

An electronic device is provided, which includes an oscillator, a controller, and a test circuit. The oscillator generates a clock signal according to an enable signal. The oscillator determines a period of the clock signal according to an adjustment signal. The controller generates the enable signal and generates a first test signal according to the clock signal. The controller determines the period according to a first comparison signal and a second comparison signal. The test circuit, through the first test signal, tests the period to generate the first comparison signal and the second comparison signal.

17 Claims, 8 Drawing Sheets

(56) References Cited

U.S. PATENT DOCUMENTS

| | | | |
|---|---|---|---|
| 2012/0249114 A1* | 10/2012 | Sako | H03L 1/022 |
| | | | 323/312 |
| 2016/0094212 A1 | 3/2016 | Kordik | |
| 2016/0329819 A1* | 11/2016 | Chen | H02M 3/33592 |
| 2017/0017258 A1* | 1/2017 | Park | G06F 1/04 |
| 2018/0107135 A1* | 4/2018 | Kinokuni | G03G 15/5037 |
| 2021/0141008 A1* | 5/2021 | Chen | G01R 31/312 |

\* cited by examiner

600

ELECTRONIC DEVICE FOR SELF-TESTING PERIOD OF CLOCK SIGNAL AND MONITORING METHOD THEREOF

CROSS REFERENCE TO RELATED APPLICATIONS

This Application claims priority of Taiwan Patent Application No. 111131863, filed on Aug. 24, 2022, the entirety of which is incorporated by reference herein.

BACKGROUND OF THE INVENTION

Field of the Invention

The present invention relates to an electronic device and a monitoring method, in particular to an electronic device for self-testing the period of a clock signal and a monitoring method for monitoring the clock signal.

Description of the Related Art

In a digital integrated circuit, the accuracy of the frequency of the internal clock signal is usually maintained by a phase-locked loop (PLL). However, the phase-locked loop not only takes up circuit area and consumes power, but also an additional clock signal is required to monitor whether the frequency of the internal clock signal is accurate. When the circuit area of the digital integrated circuit is not large, it is a very troublesome issue whether a phase-locked loop with an area that that is similar to or even exceeds the circuit area of the main digital integrated circuit is needed to maintain the accuracy of the frequency of the internal clock signal.

However, some small digital integrated circuits require the precise frequency of the clock signal, so it is necessary to optimize the way of monitoring the frequency of the clock signal and correcting the frequency when a frequency deviation is found. In addition, the cost required to achieve this goal needs to be kept as low as possible.

BRIEF SUMMARY OF THE INVENTION

The present invention provides an electronic device and a monitoring method thereof, so that the electronic device may monitor and correct the internal clock signal by itself. In addition, due to the simple structure of the test circuit, not only being the period and the frequency of the clock signal may be able to be effectively monitored and corrected, but also the required circuit area and power consumption are much less than that of a phase-locked loop, which is helpful for improving the accuracy of the internal clock signal under limited conditions.

In an embodiment, an electronic device comprises an oscillator, a controller, and a test circuit. The oscillator generates a clock signal according to an enable signal. The oscillator determines a period of the clock signal according to an adjustment signal. The controller generates the enable signal and generates a first test signal according to the clock signal. The controller determines the period according to a first comparison signal and a second comparison signal. The test circuit, through the first test signal, tests the period to generate the first comparison signal and the second comparison signal.

According to an embodiment of the invention, the controller further generates the adjustment signal to adjust the period within a target range.

According to an embodiment of the invention, the controller generates the enable signal and the adjustment signal according to an external command, so that the oscillator begins generating the clock signal. When the controller receives the clock signal, the controller generates the first test signal and a second test signal. The first test signal comprises a first pulse width and the second test signal comprises a second pulse width. The second pulse width exceeds the first pulse width.

According to an embodiment of the invention, the test circuit comprises a test capacitor. The test capacitor is charged with a first current during the first pulse width to generate a test voltage at a first node. The test circuit generates the first comparison signal and the second comparison signal according to the test voltage, and the controller determines whether the period is within the target range according to the first comparison signal and the second comparison signal to generate the adjustment signal.

According to an embodiment of the invention, the test circuit comprises a first current source, a first transistor, a second transistor, a first power source, a first comparator, and a second comparator. The first current source generates a first current. The first transistor charges the test capacitor with the first current according to the first test signal to generate the test voltage. The test capacitor is coupled between the first node and a ground. The second transistor couples the first node to the ground according to the second test signal. The first power source generates a first reference voltage and a second reference voltage. The first comparator compares the test voltage with the first reference voltage to generate the first comparison signal. The second comparator compares the test voltage with the second reference voltage to generate the second comparison signal.

According to an embodiment of the invention, when the test circuit tests the period, the first transistor is turned on according to the first test signal, and the second transistor is turned off according to the second test signal.

According to another embodiment of the invention, when the test circuit does not test the period, the first transistor is turned off according to the first test signal, and the second transistor couples the first node to the ground according to the second test signal.

According to an embodiment of the invention, when the controller determines that the test voltage is between the first reference voltage and the second reference voltage according to the first comparison signal and the second comparison signal, the controller determines that the period is within the target range and does not adjust the period.

According to another embodiment of the invention, when the controller determines that the test voltage exceeds the first reference voltage and the second reference voltage according to the first comparison signal and the second comparison signal, the controller determines that the period exceeds the target range and adjusts the period by using the adjustment signal.

According to yet another embodiment of the invention, when the controller determines that the test voltage is less than the first reference voltage and the second reference voltage according to the first comparison signal and the second comparison signal, the controller determines that the period is less than the target range and adjusts the period by using the adjustment signal.

According to an embodiment of the invention, the oscillator comprises a second power source and a second current source, a current adjusting circuit, a current mirror, an oscillation capacitor, a third transistor, a fourth transistor, and an inverter. The second power source and the second current source generate a second current according to the enable signal. The current adjusting circuit receives the second current to generate a third current and adjusts a ratio of the third current to the second current according to the adjustment signal. The current mirror mirrors the third current to a fourth current and a fifth current. The oscillation capacitor is coupled between a second node and the ground and charged by the fourth current. The third transistor couples the second node to the ground according to the clock signal. The fourth transistor comprises a first terminal, a second terminal, and a control terminal, where the first terminal receives the fifth current, the second terminal is coupled to the ground, and the control terminal is coupled to the second node. The inverter generates the clock signal according to the voltage of the first terminal of the fourth transistor.

According to an embodiment of the invention, the first voltage source or the second voltage source is a first bandgap reference voltage circuit, and the other of the first voltage source and the second voltage source is a second bandgap reference voltage circuit. The first bandgap reference voltage circuit comprises a plurality of bipolar junction transistors, and the second bandgap reference voltage circuit comprises an enhancement-mode transistor and a depletion-mode transistor.

In another embodiment, a monitoring method adapted in an electronic device is provided. The electronic device comprises an oscillator. The monitoring method comprises the following steps. An external command is received. The oscillator is enabled to generate a clock signal according to the external command. A charging period is generated by using the clock signal. A test capacitor is charged with a first current during the charging period to generate a test voltage. Whether a period of the clock signal is within a target range is determined according to the test voltage.

According to an embodiment of the invention, the step of charging a test capacitor with the first current during the charging period to generate the test voltage comprises the following steps. The first current is generated by using a first current source. A first test signal is generated by using the clock signal, where the first test signal comprises a first pulse width, and the first pulse width is equal to the charging period. The test capacitor is charged by using the first current according to a first test signal.

According to an embodiment of the invention, the step of determining whether the period of the clock signal is within the target range according to the test voltage comprises the following steps. The test voltage is compared with a first reference voltage to generate a first comparison signal. The test voltage is compared with a second reference voltage to generate a second comparison signal. Whether the period is within the target range is determined according to the first comparison signal and the second comparison signal. The monitoring method further comprises the following steps. When the period is not within the target range, the period is adjusted. When the period is within the target range, the period is not adjusted.

According to an embodiment of the invention, the step of determining whether the period is within the target range according to the first comparison signal and the second comparison signal further comprises the following steps. When it is determined that the test voltage is between the first reference voltage and the second reference voltage according to the first comparison signal and the second comparison signal, it is determined that the period is within the target range.

According to an embodiment of the invention, the step of determining whether the period is within the target range according to the first comparison signal and the second comparison signal further comprises the following steps. When it is determined that the test voltage exceeds the first reference voltage and the second reference voltage according to the first comparison signal and the second comparison signal, it is determined that the period exceeds the target range.

According to an embodiment of the invention, the oscillator further comprises an oscillation capacitor and the clock signal is generated by charging and discharging the oscillation capacitor with a second current. The step of adjusting the period when the period is not within the target range further comprises the following step. The second current is increased to lower the period.

According to an embodiment of the invention, the step of determining whether the period is within the target range according to the first comparison signal and the second comparison signal further comprises the following step. When it is determined that the test voltage is less than the first reference voltage and the second reference voltage according to the first comparison signal and the second comparison signal, it is determined that the period is less than the target range.

According to an embodiment of the invention, the oscillator further comprises an oscillation capacitor and the clock signal is generated by charging and discharging the oscillation capacitor with a second current. The step of adjusting the period when the period is not within the target range further comprises the following step. The second current is decreased to increase the period.

A detailed description is given in the following embodiments with reference to the accompanying drawings.

BRIEF DESCRIPTION OF DRAWINGS

The invention can be more fully understood by reading the subsequent detailed description and examples with references made to the accompanying drawings, wherein.

DETAILED DESCRIPTION OF THE INVENTION

Figure 1:
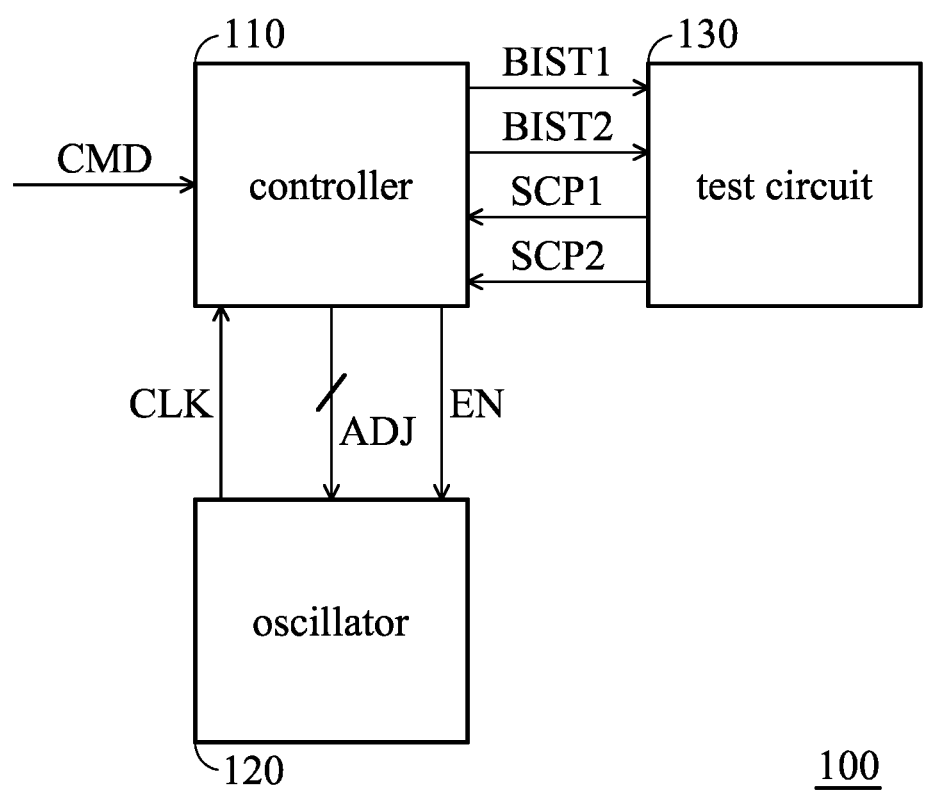
FIG. 1 shows a block diagram of an electronic device in accordance with an embodiment of the present invention.

The following description is made for the purpose of illustrating the general principles of the disclosure and should not be taken in a limiting sense. The scope of the disclosure is determined by reference to the appended claims.

In the following detailed description, for purposes of explanation, numerous specific details and embodiments are set forth in order to provide a thorough understanding of the present disclosure. The use of like and/or corresponding numerals in the drawings of different embodiments does not suggest any correlation between different embodiments.

In addition, in this specification, relative spatial expressions are used. For example, "lower", "bottom", "higher" or "top" are used to describe the position of one element relative to another. It should be appreciated that if a device is flipped upside down, an element that is "lower" will become an element that is "higher".

It should be understood that, although the terms first, second, third etc. may be used herein to describe various elements, components, regions, layers, portions and/or sections, these elements, components, regions, layers, portions and/or sections should not be limited by these terms. These terms are only used to distinguish one element, component, region, layer, portion or section from another element, component, region, layer or section. Thus, a first element, component, region, layer, portion or section in the specification could be termed a second element, component, region, layer, portion or section in the claims without departing from the teachings of the present disclosure.

It should be understood that this description of the exemplary embodiments is intended to be read in connection with the accompanying drawings, which are to be considered part of the entire written description. The drawings are not drawn to scale. In addition, structures and devices are shown schematically in order to simplify the drawing.

The terms "approximately", "about" and "substantially" typically mean a value is within a range of +/−20% of the stated value, more typically a range of +/−10%, +/−5%, +/−3%, +/−2%, +/−1% or +/−0.5% of the stated value. The stated value of the present disclosure is an approximate value. Even there is no specific description, the stated value still includes the meaning of "approximately", "about" or "substantially".

Unless defined otherwise, all technical and scientific terms used herein have the same meaning as commonly understood by one of ordinary skill in the art to which this disclosure belongs. It should be appreciated that, in each case, the term, which is defined in a commonly used dictionary, should be interpreted as having a meaning that conforms to the relative skills of the present disclosure and the background or the context of the present disclosure, and should not be interpreted in an idealized or overly formal manner unless so defined.

In addition, in some embodiments of the present disclosure, terms concerning attachments, coupling and the like, such as "connected" and "interconnected," refer to a relationship wherein structures are secured or attached to one another either directly or indirectly (for example, electrically connection) via intervening structures, as well as both movable or rigid attachments or relationships, unless expressly described otherwise.

FIG. 1 shows a block diagram of an electronic device in accordance with an embodiment of the present invention. As shown in FIG. 1, the electronic device 100 includes a controller 110, an oscillator 120, and a test circuit 130. The controller 110 receives the external command CMD and generates the enable signal EN to enable the oscillator 120 to generate the clock signal CLK, and the controller 110 generates the adjustment signal ADJ to adjust the period of the clock signal CLK (or the frequency, the period is configured as an illustration below).

According to one embodiment of the present invention, when the controller 110 receives the clock signal CLK, the controller 110 generates the first test signal BIST1 and the second test signal BIST2, so that the test circuit 130, according to the first test signal BIST1 and the second test signal BIST2, tests the period of the clock signal CLK to generate a first comparison signal SCP1 and a second comparison signal SCP2.

The controller 110 determines whether the period of the clock signal CLK is within the target range according to the first comparison signal SCP1 and the second comparison signal SCP2. When the period of the clock signal CLK is not within the target range, the controller 110 utilizes the adjustment signal ADJ to adjust the period of the clock signal CLK generated by the oscillator 120.

According to an embodiment of the present invention, when the controller 110 receives the external command CMD to generate the enable signal EN and receives the clock signal CLK, the controller 110 generates the first test signal BIST1 and the second test signal BIST2 to control the test circuit 130 to test the period of the clock signal CLK. In other words, the test circuit 130 tests the period of the clock signal CLK when the oscillator 120 is started up. After the controller 110 finishes adjusting the period of the clock signal CLK, the controller 110 utilizes the adjusted clock signal CLK to perform subsequent operations.

Figure 2:
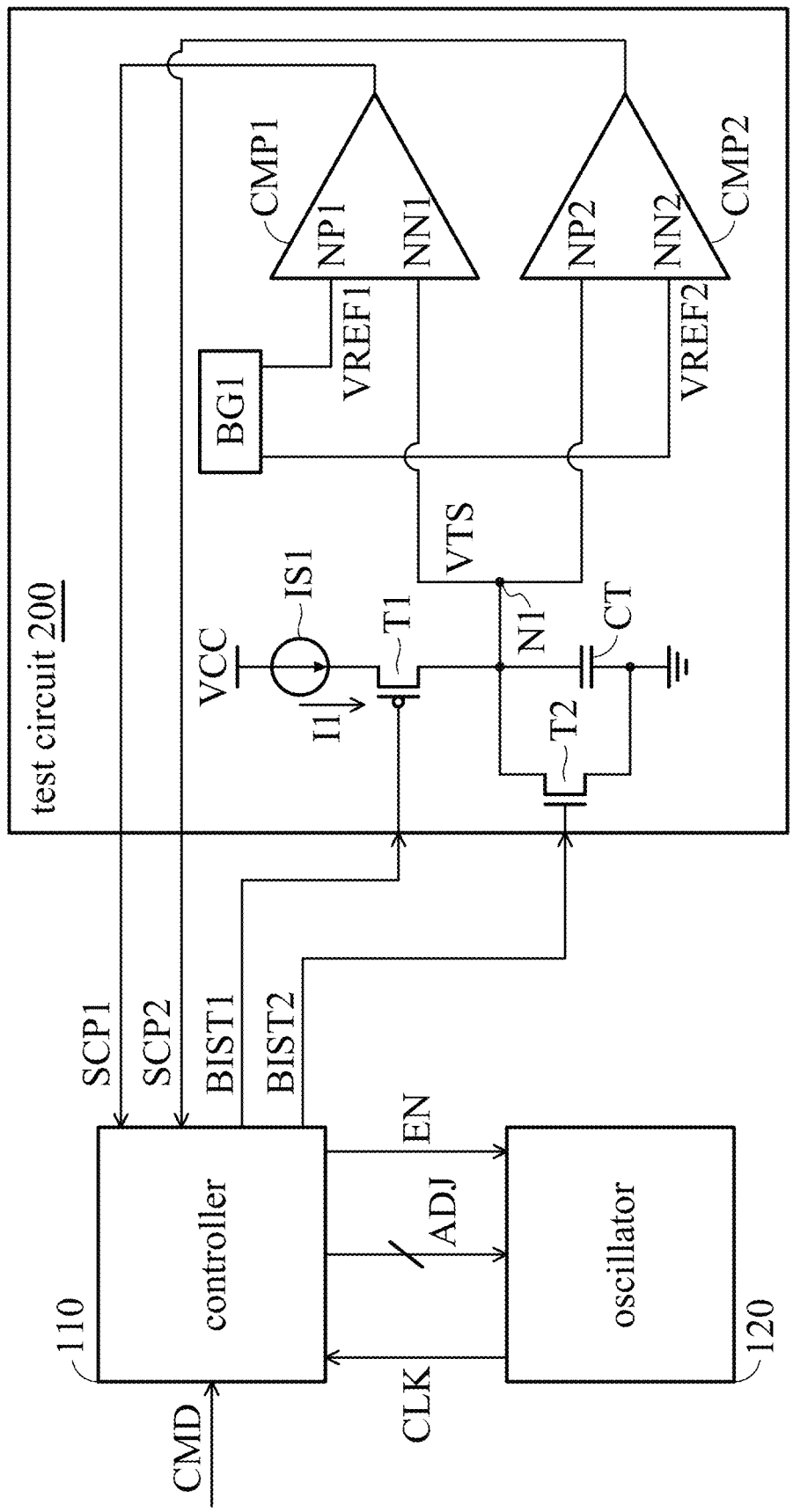
FIG. 2 shows a circuit diagram of a test circuit in accordance with an embodiment of the present invention.

FIG. 2 shows a circuit diagram of a test circuit in accordance with an embodiment of the present invention. As shown in FIG. 2, the test circuit 200 includes a first current source IS1, a first transistor T1, a second transistor T2, a test capacitor CT, a first voltage source BG1, a first comparator CMP1, and a second comparator CMP2.

The first current source IS1 generates the first current I1 flowing from the supply voltage VCC to the first transistor T1, and the first transistor T1 provides the first current I1 to the first node N1 according to the first test signal BIST1 to generate a test voltage VTS. The second transistor T2 couples the first node N1 to the ground according to the second test signal BIST2. The test capacitor CT is coupled between the first node N1 and the ground.

The first voltage source BG1 generates a first reference voltage VREF1 and a second reference voltage VREF2. According to an embodiment of the present invention, the first reference voltage VREF1 exceeds the second reference voltage VREF2. According to an embodiment of the present invention, the first current source IS1 combines with the first voltage source BG1 to generate the first current I1 having a low temperature coefficient. According to an embodiment of the present invention, the first voltage source BG1 is a bandgap reference voltage circuit.

The first comparator CMP1 includes a first positive terminal NP1 and a first negative terminal NN1, where the first positive terminal NP1 receives the first reference voltage VREF1, and the first negative terminal NN1 receives the test voltage VTS. The first comparator CMP1 compares the test voltage VTS with the first reference voltage VREF1 to generate a first comparison signal SCP1. The second comparator CMP2 includes a second positive terminal NP2 and a second negative terminal NN2, where the second positive terminal NP2 receives the test voltage VTS, and the second negative terminal NN2 receives the second reference voltage VREF2. The second comparator CMP2 compares the test voltage VTS with the second reference voltage VREF2 to generate the second comparison signal SCP2.

Figure 3:
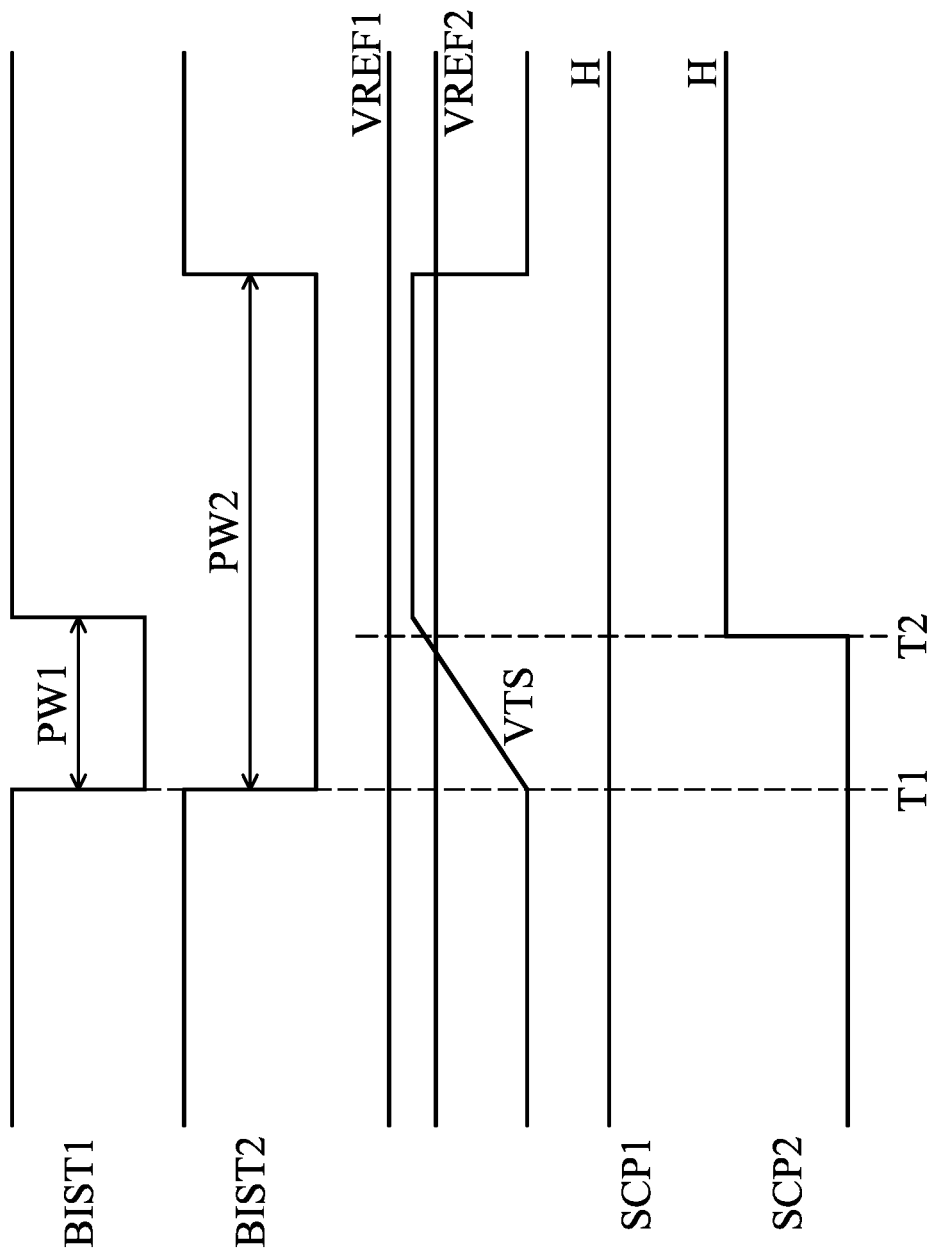
FIG. 3 shows a waveform diagram of a test circuit in accordance with an embodiment of the present invention.

FIG. 3 shows a waveform diagram of a test circuit in accordance with an embodiment of the present invention. The following description will be accompanied with the circuit diagram in FIG. 2 and the waveform diagram in FIG. 3 for detailed explanation.

As shown in FIG. 3, at the first time T1, the controller 110 converts the first test signal BIST1 and the second test signal BIST2 from a high voltage level to a low voltage level, where the first test signal BIST1 includes the first pulse width PW1, the second test signal BIST2 includes a second pulse width PW2, and the first pulse width PW1 is less than the second pulse width PW2. According to an embodiment of the present invention, the first pulse width PW1 and the second pulse width PW2 are generated by the period of the clock signal CLK.

According to other embodiments of the present invention, the controller 110 may also convert the first test signal BIST1 and the second test signal BIST2 from a low voltage level to a high voltage level at the first time T1. It is illustrated that the voltage level is converted from the high voltage level to the low voltage level, which is not intended to be limited thereto.

As shown in FIG. 2, during the first pulse width PW1, since the first test signal BIST1 and the second test signal BIST2 are both at the low voltage level, the first transistor T1 is turned on and the second transistor T1 is turned on, the second transistor T2 is turned off, and the test capacitor CT is charged by the first current I1 to generate the test voltage VTS. According to an embodiment of the present invention, since the test capacitor CT is charged during the first pulse width PW1, the first pulse width PW1 can also be regarded as the charging period of the test capacitor CT.

As shown in FIG. 3, the test voltage VTS starts to climb from the first time T1. At the second time T2, the test voltage VTS exceeds the second reference voltage VREF2, so that the second comparison signal SCP2 is converted to a high voltage level H at the second time T2. In addition, since the test voltage VTS is always less than the first reference voltage VREF1, the first comparison signal SCP1 keeps at the high voltage level H.

According to an embodiment of the present invention, the controller 110 may determine that the period of the clock signal CLK is within the target range according to the first comparison signal SCP1 and the second comparison signal SCP2 both being at the high voltage level H, without adjusting the period of the clock signal CLK by the adjustment signal ADJ.

According to another embodiment of the present invention, when the test voltage VTS exceeds the first reference voltage VREF1 and the second reference voltage VREF2 during the first pulse width PW1, the controller 110 may determine that the period of the clock signal CLK exceeds the target range based on the first comparison signal SCP1 being at the low voltage level and the second comparison signal SCP2 being at the high voltage level H, so that the period of the clock signal CLK may be reduced by the adjustment signal ADJ.

According to yet another embodiment of the present invention, when the test voltage VTS is less than the first reference voltage VREF1 and the second reference voltage VREF2 during the first pulse width PW1, the controller 110 may determine that the period of the clock signal CLK is less than the target range based on the first comparison signal SCP1 being at high the voltage level H and the second comparison signal SCP2 being at the low voltage level, so that the period of the clock signal CLK can be increased by the adjustment signal ADJ.

As shown in FIG. 3, when the test circuit 200 does not test the period of the clock signal CLK, both the first test signal BIST1 and the second test signal BIST2 are at the high voltage level, so that the first transistor T1 is not turned on to stop the first current I1 charging the test capacitor CT, and the second transistor T2 is turned on to discharge the test capacitor CT to the ground. According to other embodiments of the present invention, when the test circuit 200 does not test the period of the clock signal CLK, the controller 110 may power off the first current source IS1, the first voltage source VS1, the first comparator CMP1, and the second comparator CMP2 to reduce overall power loss.

Figure 4:
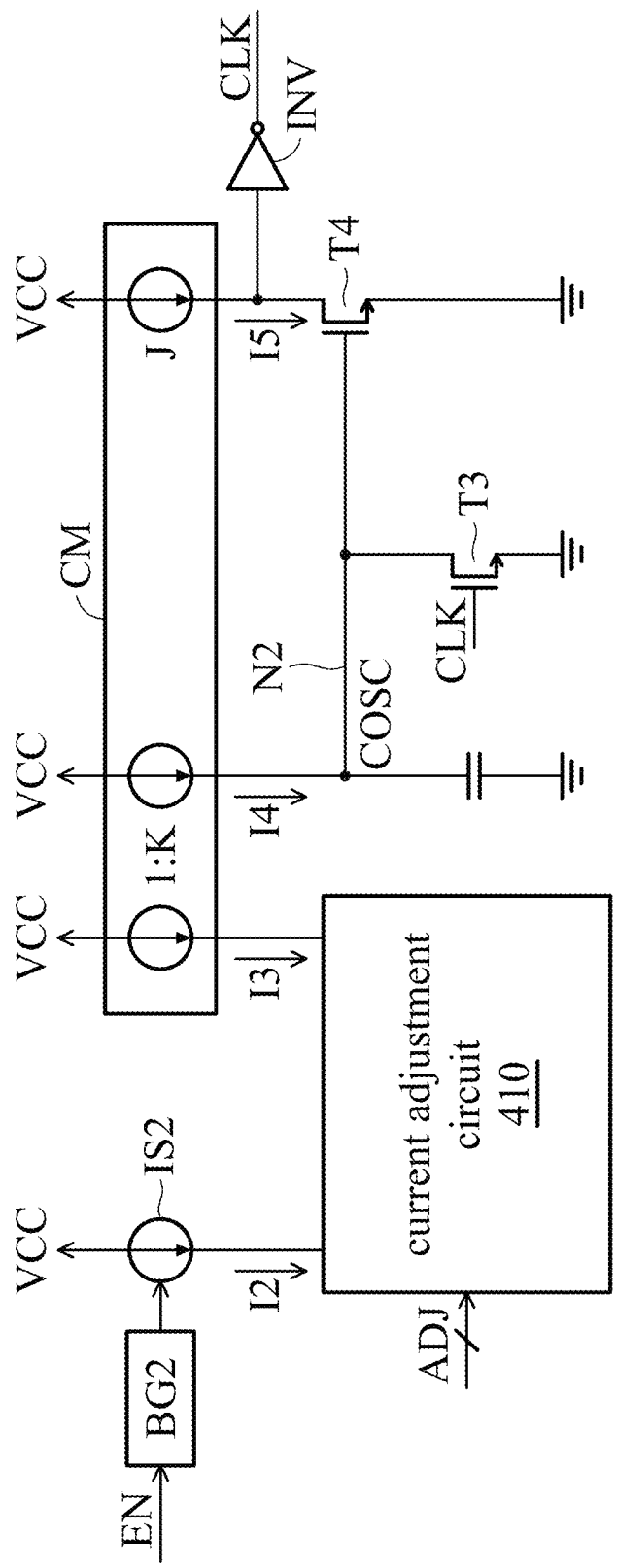
FIG. 4 shows a circuit diagram of an oscillator in accordance with an embodiment of the present invention.

FIG. 4 shows a circuit diagram of an oscillator in accordance with an embodiment of the present invention, where the oscillator 400 in FIG. 4 corresponds to the oscillator 120 in FIGS. 1 and 2. As shown in FIG. 4, the oscillator 400 includes a second voltage source BG2, a second current source IS2, a current adjustment circuit 410, a current mirror CM, an oscillating current COSC, a third transistor T3, a fourth transistor T4, and an inverting device INV.

The second voltage source BG2 and the second current source IS2 generate the second current I2 according to the enable signal EN. According to an embodiment of the present invention, the second voltage source BG2 is a bandgap reference voltage circuit. According to an embodiment of the present invention, the second current source IS2 and the second voltage source BG2 are configured to generate the second current I2 having a low temperature coefficient. The current adjustment circuit 410 receives the second current I2 to generate a third current I3, and changes the ratio of the third current I3 to the second current I2 according to the adjustment signal ADJ.

The current mirror CM mirrors the third current I3 to the fourth current I4 and the fifth current I5, where the ratio of the fourth current I4 to the third current I3 is K, and the ratio of the fifth current I5 to the third current I3 is J. The oscillation capacitor COSC is coupled between the second node N2 and the ground, and is charged by the fourth current I4.

The third transistor T3 couples the second node N2 to the ground according to the clock signal CLK. The fourth transistor T4 includes a first terminal, a second terminal, and a control terminal, where the first terminal receives the fifth current I5, the second terminal is coupled to the ground, and the control terminal is coupled to the second node N2. The inverter INV generates the clock signal CLK according to the voltage of the first terminal of the fourth transistor T4.

According to an embodiment of the present invention, when the fourth current I4 charges the oscillation capacitor COSC, the voltage of the second node N2 continues to rise from the low voltage level, and the clock signal CLK is at the low voltage level at this time. According to another embodiment of the present invention, when the voltage of the second node N2 is sufficient to turn on the fourth transistor T4, the clock signal CLK is at a high voltage level (that is, the supply voltage VDD), and then the third transistor T3 is turned on to discharge the oscillation capacitor COSC (that is, the voltage of the second node N2) to the ground.

Figure 5:
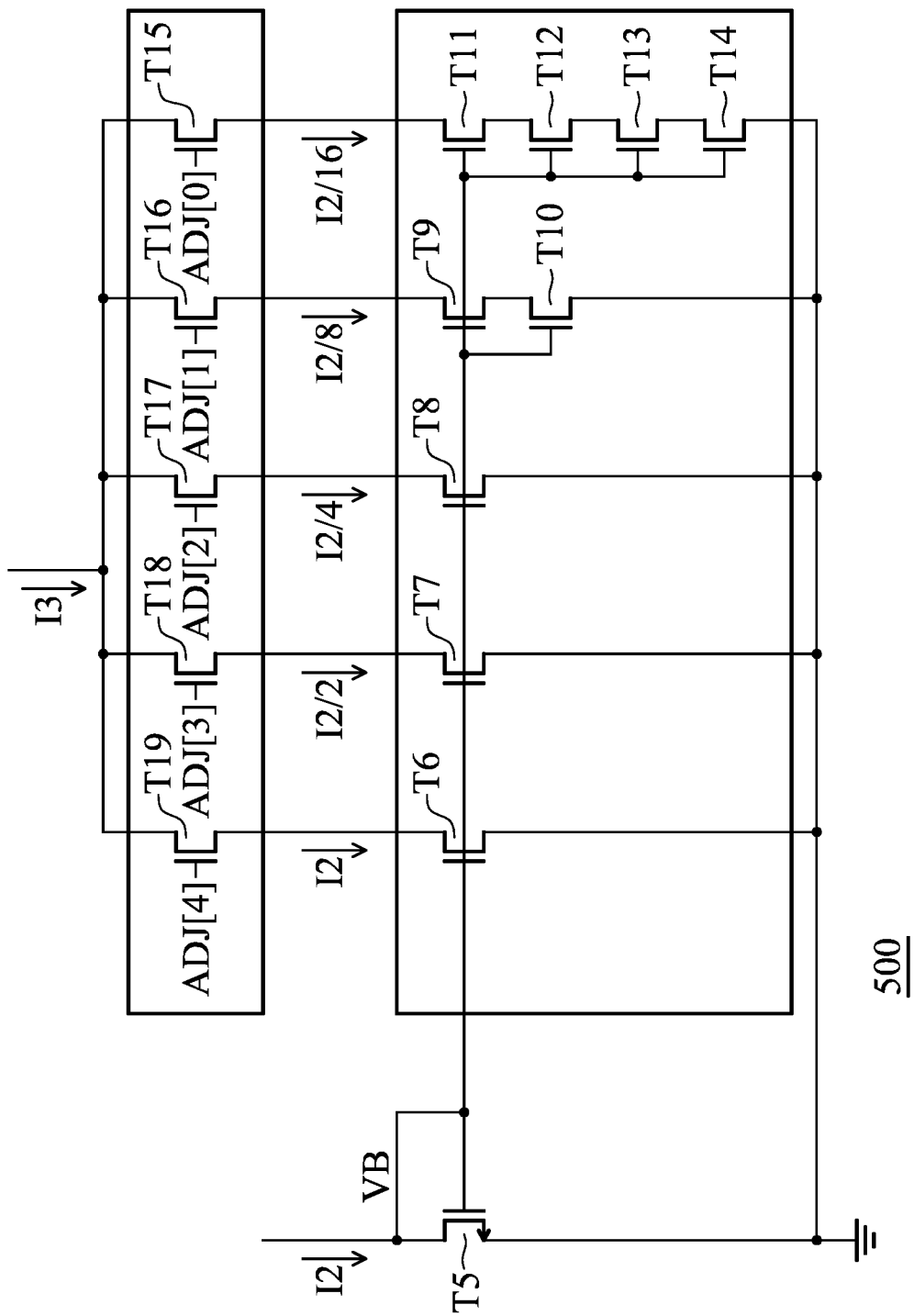
FIG. 5 shows a circuit diagram of a current regulation circuit in accordance with an embodiment of the present invention.

FIG. 5 shows a circuit diagram of a current regulation circuit in accordance with an embodiment of the present invention, where the current adjusting circuit 500 corresponds to the current adjusting circuit 410 in FIG. 4. In the following paragraphs, the 5-bit adjustment signal ADJ is illustrated for explanation, and it is not limited thereto.

As shown in FIG. 5, the current adjustment circuit 500 includes a fifth transistor T5, a sixth transistor T6, a seventh transistor T7, an eighth transistor T8, a ninth transistor T9, a tenth transistor T10, the eleventh transistor T11, the twelfth transistor T12, the thirteenth transistor T13, and the fourteenth transistor T14.

The fifth transistor T5 receives the second current I2 and is coupled in the form of a diode, and generates a bias voltage VB by the second current I2 flowing through the fifth transistor T5, where the bias voltage VB is coupled to the control terminals of the sixth transistor T6, the seventh transistor T7, the eighth transistor T8, the ninth transistor T9, the tenth transistor T10, the eleventh transistor T11, the twelfth transistor T12, the thirteenth transistor T13, and the fourteenth transistor T14.

According to an embodiment of the present invention, the sixth transistor T6 has the same width-to-length ratio as the fifth transistor T5, so the current flowing through the sixth transistor T6 is the same as the current flowing through the fifth transistor T5. According to other embodiments of the present invention, the width-to-length ratio of the sixth transistor T6 is Y times of that of the fifth transistor T5. It is illustrated that the sixth transistor T6 has the same width-to-length ratio as that of the fifth transistor T5, and it is not intended to be limited thereto.

The width-to-length ratios of the seventh transistor T7 and the eighth transistor T8 are respectively ½ and ¼ of the fifth transistor T5, so the currents flowing through the seventh transistor T7 and the eighth transistor T8 are respectively ½ and ¼ of that flowing through the fifth transistor T5. The width-to-length ratios of the ninth transistor T9 and the tenth transistor T10 are the same as that of the eighth transistor T8, and the ninth transistor T9 and the tenth transistor T10 are connected in series, so that the currents flowing through the ninth transistor T9 and the tenth transistor T10 may be considered as half of that flowing through the eighth transistor T8.

In addition, the width-to-length ratios of the eleventh transistor T11, the twelfth transistor T12, the thirteenth transistor T13, and the fourteenth transistor T14 are the same as that of the eighth transistor T8, plus the eleventh transistor T11, the twelfth transistor T12, the thirteenth transistor T13, and the fourteenth transistor T14 are connected in series, so that the current flowing through the eleventh transistor T11, the twelfth transistor T12, the thirteenth transistor T13, and the fourteenth transistor T14 are regarded as ¼ of the current flowing through the eighth transistor T8.

As shown in FIG. 5, the current adjustment circuit 500 further includes a fifteenth transistor T15, a sixteenth transistor T16, a seventeenth transistor T17, an eighteenth transistor T18, and a nineteenth transistor T19, and those are controlled by the first bit adjustment signal ADJ[0], the second bit adjustment signal ADJ[1], the third bit adjustment signal ADJ[2], the fourth bit adjustment signal ADJ[3], and the fifth adjustment signal ADJ[4] respectively.

For example, when the seventeenth transistor T17 and the nineteenth transistor T19 are turned on by the adjustment signal ADJ[4:0], the ratio of the third current I3 to the second current I2 is 9/8. In other words, the controller 110 selects at least one of the fifteenth transistor T15, the sixteenth transistor T16, the seventeenth transistor T17, the eighteenth transistor T18, and the nineteenth transistor T19 by the adjustment signal ADJ, so as to adjust the third current I3.

Referring to FIG. 4, the oscillation capacitor COSC is charged by the fourth current I4, and the fourth current I4 is K times of the third current I3. When the controller 110 increases or decreases the magnitude of the third current I3 through the adjustment signal ADJ, the period of the clock signal CLK is also decreased or increased accordingly, thereby achieving the purpose of adjusting the period (or frequency) of the clock signal CLK.

Figure 6:
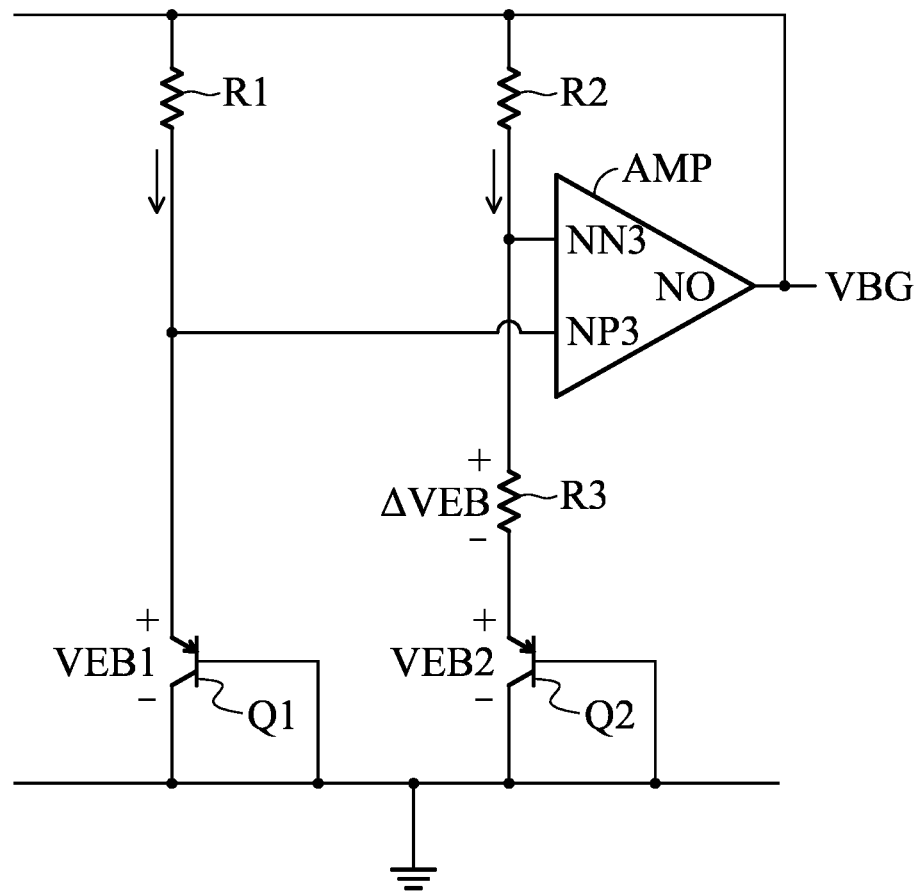
FIG. 6 shows a circuit diagram of a bandgap reference voltage circuit in accordance with an embodiment of the present invention.

FIG. 6 shows a circuit diagram of a bandgap reference voltage circuit in accordance with an embodiment of the present invention. As shown in FIG. 6, the bandgap reference voltage circuit 600 includes a first resistor R1, a second resistor R2, a third resistor R3, a first bipolar junction transistor Q1, a second bipolar junction transistor Q2, and an amplifier AMP.

The first resistor R1 is connected in series with the first bipolar junction transistor Q1, and the third resistor R3 is coupled between the second resistor R2 and the second bipolar junction transistor Q2. The amplifier AMP includes a third negative terminal NN3, a third positive terminal NP3, and an output terminal NO, where the third negative terminal NN3 is coupled between the first resistor R1 and the first bipolar junction transistor Q1, the third positive terminal NP3 is coupled between the second resistor R2 and the third resistor R3, and the output terminal NO is coupled between the first resistor R1 and the second resistor R2 and outputs the bandgap reference voltage VBG.

The energy gap reference voltage VBG is as shown in Eq. 1:

$$VBG = VEB1 + \frac{\Delta VEB}{R3} \times R2 \qquad \text{(Eq. 1)}$$

VEB1 is the cross-voltage of the first bipolar junction transistor Q1, VEB2 is the cross-voltage of the second bipolar junction transistor Q2, and ΔVEB is shown in Eq. 2:

$$\Delta VEB = VEB1 - VEB2 \qquad \text{(Eq. 2)}$$

Since VEB1 has a positive temperature coefficient and ΔVEB has a negative temperature coefficient, the ratio of the second resistor R2 to the third resistor R3 is adjusted to minimize the temperature coefficient of the bandgap reference voltage VBG. According to an embodiment of the present invention, since the bandgap reference voltage VBG has a low temperature coefficient, a current having a low temperature coefficient can be generated by combining a resistor having a zero temperature coefficient or a low temperature coefficient.

Figure 7:
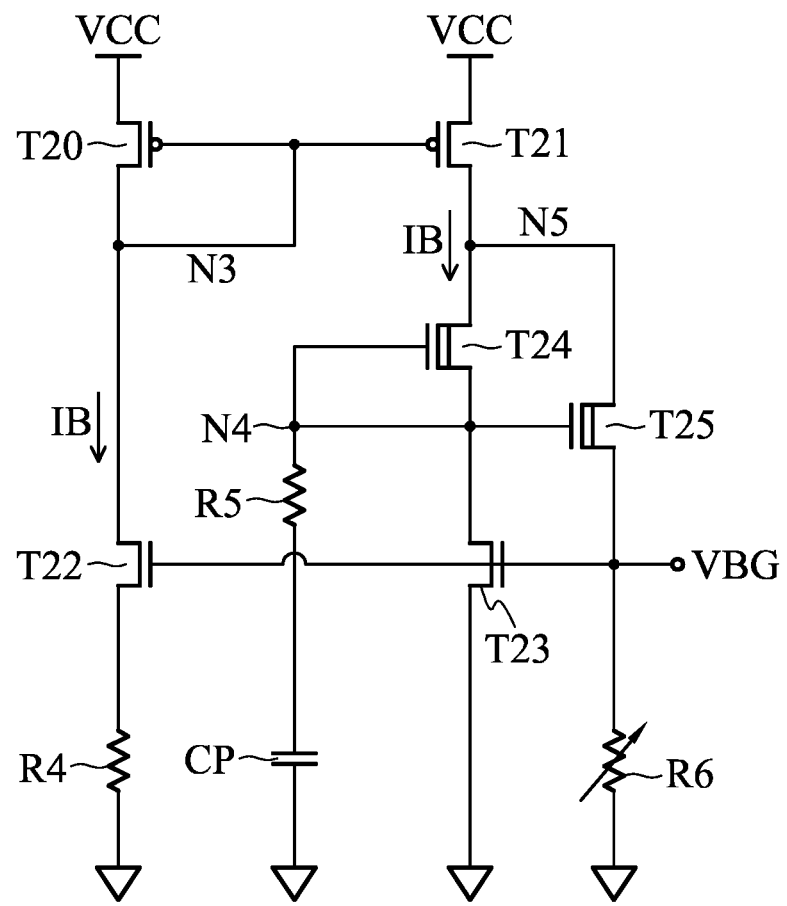
FIG. 7 shows a circuit diagram of a bandgap reference voltage circuit in accordance with another embodiment of the present invention.

FIG. 7 shows a circuit diagram of a bandgap reference voltage circuit in accordance with another embodiment of the present invention. As shown in FIG. 7, the energy gap reference voltage circuit 700 includes a twentieth transistor T20, a twenty-first transistor T21, a twenty-second transistor T22, a twenty-third transistor T23, a twenty-fourth transistor The crystal T24, the twenty-fifth transistor T25, the fourth resistor R4, the fifth resistor R5, the filter capacitor CP, and the sixth resistor R6. According to an embodiment of the present invention, the twentieth transistor T20 and the twenty-first transistor T21 are enhancement-mode P-type transistors, and the twenty-second transistor T22 and the twenty-third transistor T23 are enhancement-mode N-type transistors. The twenty-fourth transistor T24 and the twenty-fifth transistor T25 are depletion-mode transistors.

The twentieth transistor T20 is coupled as a diode, and is coupled between the supply voltage VCC and the third node N3. The control terminal of the twenty-first transistor T21 is coupled to the third node N3, the first terminal of the twenty-first transistor T21 is coupled to the supply voltage VCC, and the second terminal of the twenty-first transistor T21 is coupled to the fifth node N5.

The control terminal of the twenty-second transistor T22 is coupled to the bandgap reference voltage VBG, the first terminal of the twenty-second transistor T22 is coupled to the fourth resistor R4, the second terminal of the twenty-second transistor T22 is coupled to the third node N3, and the fourth resistor R4 is coupled to the ground. The control terminal of the twenty-third transistor T23 is coupled to the bandgap reference voltage VBG, the first terminal of the twenty-third transistor T23 is coupled to the ground, and the second terminal of the twenty-third transistor T23 is coupled to the fourth node N4.

The control terminal and the first terminal of the twenty-fourth transistor T24 are coupled to the fourth node N4, and the second terminal of the twenty-fourth transistor T24 is coupled to the fifth node N5. The control terminal of the twenty-fifth transistor T25 is coupled to the fourth node N4, the first terminal of the twenty-fifth transistor T25 is coupled to the bandgap reference voltage VBG, and the second terminal of the twenty-fifth transistor T25 is coupled to the fifth node N5. The fifth resistor R5 and the filter capacitor CP are connected in series between the fourth node N4 and the ground for frequency response compensation.

The twenty-second transistor T22 is configured to generate the bias current IB with the fourth resistor R4, and the twentieth transistor T20 and the twenty-first transistor T21 are configured to mirror the bias current IB to the twenty-third transistor T23 and the twenty-fourth transistor T24. Since the current IT23 flowing through the twenty-third transistor T23 and the current IT24 flowing through the twenty-fourth transistor T24 are equal, Eq. 3 can be obtained.

$$I_{T23} = K_{T23}(VBG - VT_{T23})^2 = K_{T24}(-VT_{T24})^2 = I_{T24} \quad \text{(Eq.3)}$$

$K_{T23}$ and $K_{T24}$ are the current constants of the twenty-third transistor T23 and the twenty-fourth transistor t240 respectively, $VT_{T23}$ is the threshold voltage of the twenty-third transistor T23, and $VT_{T24}$ is the threshold voltage of the twenty-fourth transistor T24. Therefore, after re-arranging Eq. 3, the energy gap reference voltage VBG is shown in Eq. 4.

$$VBG = \sqrt{\frac{K_{T24}}{K_{T23}}} \times |VT_{T24}| + VT_{T23} \quad \text{(Eq. 4)}$$

Since the threshold voltage of the twenty-fourth transistor T24 is a positive temperature coefficient, and the threshold voltage of the twenty-third transistor T23 is a negative temperature coefficient, the width-to-length ratio of the twenty-third transistor T23 and the width-to-length ratio of the twenty-fourth transistor T24 are manipulated to minimize the temperature coefficient of the bandgap reference voltage VBG. In addition, minimizing the temperature coefficient of the sixth resistor R6 may also generate a current having a low temperature coefficient.

According to an embodiment of the present invention, the first voltage source BG1 is implemented by the bandgap reference voltage circuit 600, and the second voltage source BG2 is implemented by the bandgap reference voltage circuit 700. According to another embodiment of the present invention, the first voltage source BG1 is realized by the bandgap reference voltage circuit 700, and the second voltage source BG2 is realized by the bandgap reference voltage circuit 600. In other words, one of the first voltage source BG1 and the second voltage source BG2 is implemented by a plurality of bipolar junction transistors, and the other is implemented by an enhancement-mode transistor and a depletion-mode transistor, so as to avoid possibility of simultaneous failure of two voltage sources.

According to another embodiment of the present invention, the first current source IS1 in FIG. 2 and the second current source IS2 in FIG. 3 are independently generated to avoid common-mode failure. Common-mode failure refers to the simultaneous failure of components in two or more independent channels of the system due to interdependence, resulting in the system failing to perform its intended function.

When the oscillator 120 in FIG. 2 and the test circuit 200 utilize independent voltage sources and current sources respectively, failure of any voltage source and any current source will cause the period of the clock signal CLK to be abnormal, and the probability that the voltage sources and/or current sources of the oscillator 120 and the test circuit 200 fail simultaneously may be reduced. Through the first comparison signal SCP1 and the second comparison signal SCP2, the controller 110 may determine that the voltage sources and/or current sources of the oscillator 120 and the test circuit 200 is/are abnormal, which causes the period of the clock signal CLK to shift. In addition, since the oscillator 120 in FIG. 2 and the test circuit 200 utilize voltage sources having different architectures, the probability of simultaneous abnormalities in the voltage sources of the oscillator 120 and the test circuit 200 in FIG. 2 can be further reduced, thereby avoiding common-mode failure.

Figure 8:
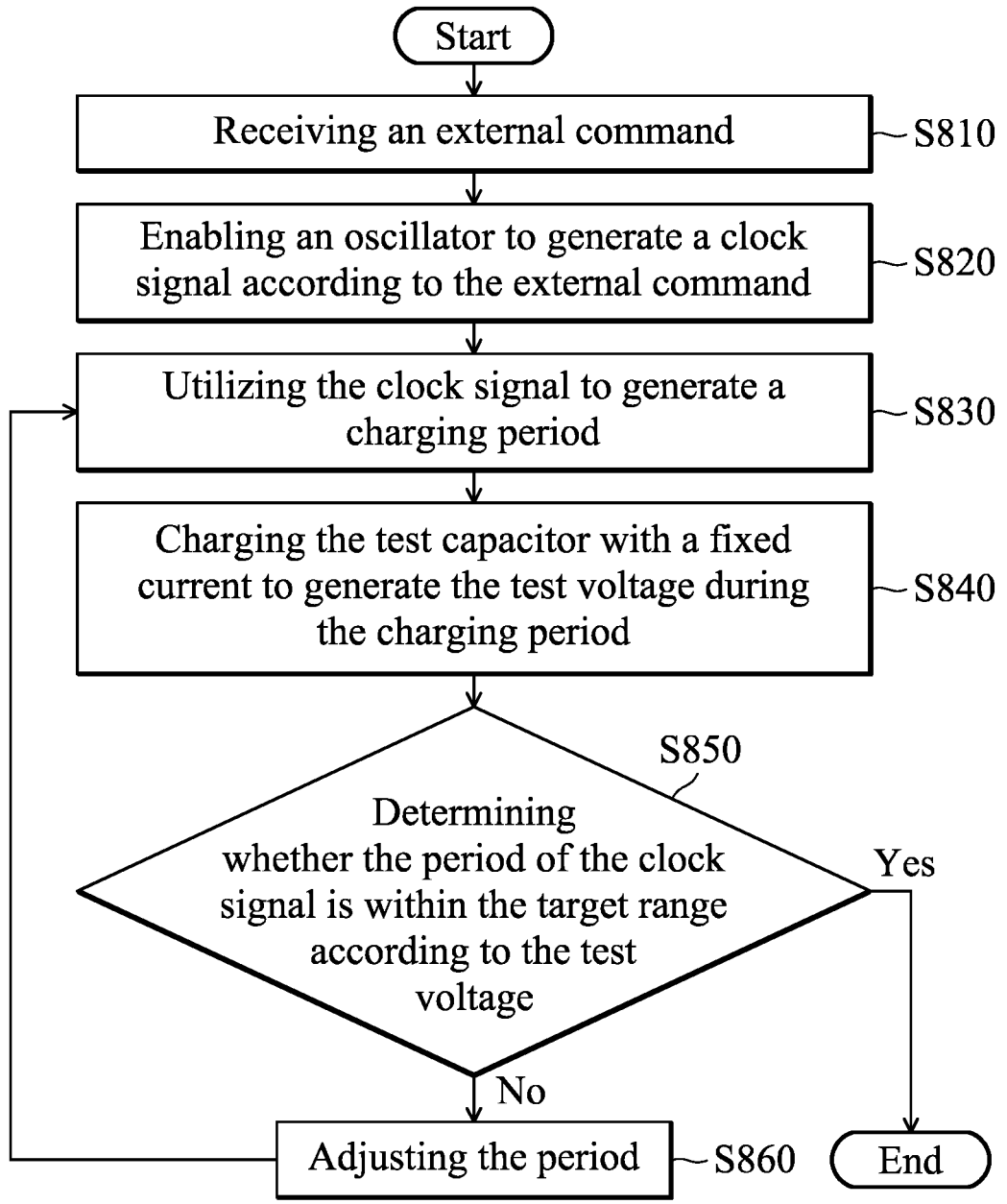
FIG. 8 shows a flowchart of a monitoring method in accordance with an embodiment of the present invention.

FIG. 8 shows a flowchart of a monitoring method in accordance with an embodiment of the present invention. The following description of the monitoring method 800 will be accompanied with the circuit diagram of FIG. 2 for detailed description.

First, the controller 110 receives an external command CMD (Step S810), and generates an enable signal EN according to the external command CMD, so that the oscillator 120 generates a clock signal CLK (Step S820). Next, the controller 110 utilizes the clock signal CLK to generate a charging period (Step S830), where the charging period is equal to the first pulse width PW1 of the first test signal BIST1.

During the charging period, the test capacitor CT is charged with a fixed current to generate the test voltage VTS (Step S840). The controller 110 determines whether the period of the clock signal CLK is within the target range according to the test voltage VTS (Step S850). When the period of the clock signal CLK is within the target range, the monitoring method 800 is terminated. When the period of the clock signal CLK is not within the target range, the controller 110 utilizes the adjustment signal ADJ to adjust the period of the clock signal CLK (Step S860), and does not stop re-executing Step S830 to Step S850 until the period of the clock signal CLK is within the target range.

The present invention provides an electronic device and a monitoring method thereof, so that the electronic device may monitor and correct the internal clock signal by itself. In addition, due to the simple structure of the test circuit, not only being the period and the frequency of the clock signal may be able to be effectively monitored and corrected, but also the required circuit area and power consumption are much less than that of a phase-locked loop, which is helpful for improving the accuracy of the internal clock signal under limited conditions.

Although some embodiments of the present disclosure and their advantages have been described in detail, it should be understood that various changes, substitutions and alterations can be made herein without departing from the spirit and scope of the disclosure as defined by the appended claims. For example, it will be readily understood by those skilled in the art that many of the features, functions, processes, and materials described herein may be varied while remaining within the scope of the present disclosure. Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. An electronic device, comprising:
   an oscillator, generating a clock signal according to an enable signal, wherein the oscillator determines a period of the clock signal according to an adjustment signal;
   a controller, generating the enable signal and generating a first test signal according to the clock signal, wherein the controller determines the period of the clock signal according to a first comparison signal and a second comparison signal; and
   a test circuit, through the first test signal, testing the period of the clock signal to generate the first comparison signal and the second comparison signal;
   wherein when the controller receives the clock signal, the controller generates the first test signal and a second test signal;
   wherein the first test signal comprises a first pulse width and the second test signal comprises a second pulse width, wherein the second pulse width exceeds the first pulse width;
   wherein the test circuit comprises:
      a test capacitor, charged with a first current during a first pulse width to generate a test voltage at a first node, wherein the test circuit generates the first comparison signal and the second comparison signal according to the test voltage, and the controller determines whether the period of the clock signal is within the target range according to the first comparison signal and the second comparison signal to generate the adjustment signal;
      a first current source, generating the first current;
      a first transistor, charging the test capacitor with the first current according to the first test signal to generate the test voltage, wherein the test capacitor is coupled between the first node and a ground;
      a second transistor, coupling the first node to the ground according to the second test signal;
      a first power source, generating a first reference voltage and a second reference voltage;
      a first comparator, comparing the test voltage with the first reference voltage to generate the first comparison signal; and
      a second comparator, comparing the test voltage with the second reference voltage to generate the second comparison signal.

2. The electronic device as defined in claim 1, wherein the controller further generates the adjustment signal to adjust the period of the clock signal within a target range.

3. The electronic device as defined in claim 2, wherein the controller generates the enable signal and the adjustment signal according to an external command, so that the oscillator begins generating the clock signal.

4. The electronic device as defined in claim 1, wherein when the test circuit tests the period of the clock signal, the first transistor is turned on according to the first test signal, and the second transistor is turned off according to the second test signal.

5. The electronic device as defined in claim 1, wherein when the test circuit does not test the period of the clock signal, the first transistor is turned off according to the first test signal, and the second transistor couples the first node to the ground according to the second test signal.

6. The electronic device as defined in claim 1, wherein when the controller determines that the test voltage is between the first reference voltage and the second reference voltage according to the first comparison signal and the second comparison signal, the controller determines that the period of the clock signal is within the target range and does not adjust the period of the clock signal.

7. The electronic device as defined in claim 1, wherein when the controller determines that the test voltage exceeds the first reference voltage and the second reference voltage according to the first comparison signal and the second comparison signal, the controller determines that the period of the clock signal exceeds the target range and adjusts the period of the clock signal by using the adjustment signal.

8. The electronic device as defined in claim 1, wherein when the controller determines that the test voltage is less than the first reference voltage and the second reference voltage according to the first comparison signal and the second comparison signal, the controller determines that the period of the clock signal is less than the target range and adjusts the period of the clock signal by using the adjustment signal.

9. The electronic device as defined in claim 1, wherein the oscillator comprises:
   a second power source and a second current source, generating a second current according to the enable signal;
   a current adjusting circuit, receiving the second current to generate a third current and adjusting a ratio of the third current to the second current according to the adjustment signal;
   a current mirror, mirroring the third current to a fourth current and a fifth current;
   an oscillation capacitor, coupled between a second node and the ground and charged by the fourth current;
   a third transistor, coupling the second node to the ground according to the clock signal;
   a fourth transistor, comprising a first terminal, a second terminal, and a control terminal, wherein the first terminal receives the fifth current, the second terminal is coupled to the ground, and the control terminal is coupled to the second node; and
   an inverter, generating the clock signal according to a voltage of the first terminal of the fourth transistor.

10. The electronic device as defined in claim 9, wherein the first voltage source or the second voltage source is a first bandgap reference voltage circuit, and the other of the first voltage source and the second voltage source is a second bandgap reference voltage circuit, wherein the first bandgap reference voltage circuit comprises a plurality of bipolar junction transistors, and the second bandgap reference voltage circuit comprises an enhancement-mode transistor and a depletion-mode transistor.

11. A monitoring method adapted in an electronic device, wherein the electronic device comprises an oscillator, wherein the monitoring method comprises:
receiving an external command;
enabling the oscillator to generate a clock signal according to the external command;
generating a charging period by using the clock signal;
charging a test capacitor with a first current during the charging period to generate a test voltage; and
determining whether a period of the clock signal is within a target range according to the test voltage;
wherein the step of determining whether the period of the clock signal is within the target range according to the test voltage comprises:
comparing the test voltage with a first reference voltage to generate a first comparison signal;
comparing the test voltage with a second reference voltage to generate a second comparison signal; and
determining whether the period of the clock signal is within the target range according to the first comparison signal and the second comparison signal;
wherein the monitoring method further comprises:
when the period of the clock signal is not within the target range, adjusting the period of the clock signal; and
when the period of the clock signal is within the target range, not adjusting the period of the clock signal.

12. The monitoring method as defined in claim 11, wherein the step of charging a test capacitor with the first current during the charging period to generate the test voltage comprises:
generating the first current by using a first current source;
generating a first test signal by using the clock signal, wherein the first test signal comprises a first pulse width, and the first pulse width is equal to the charging period; and
charging the test capacitor by using the first current according to a first test signal.

13. The monitoring method as defined in claim 11, wherein the step of determining whether the period of the clock signal is within the target range according to the first comparison signal and the second comparison signal further comprises:
when it is determined that the test voltage is between the first reference voltage and the second reference voltage according to the first comparison signal and the second comparison signal, determining that the period of the clock signal is within the target range.

14. The monitoring method as defined in claim 11, wherein the step of determining whether the period of the clock signal is within the target range according to the first comparison signal and the second comparison signal further comprises:
when it is determined that the test voltage exceeds the first reference voltage and the second reference voltage according to the first comparison signal and the second comparison signal, determining that the period of the clock signal exceeds the target range.

15. The monitoring method as defined in claim 14, wherein the oscillator further comprises an oscillation capacitor and the clock signal is generated by charging and discharging the oscillation capacitor with a second current, wherein the step of adjusting the period of the clock signal when the period of the clock signal is not within the target range further comprises:
increasing the second current to lower the period of the clock signal.

16. The monitoring method as defined in claim 11, wherein the step of determining whether the period of the clock signal is within the target range according to the first comparison signal and the second comparison signal further comprises:
when it is determined that the test voltage is less than the first reference voltage and the second reference voltage according to the first comparison signal and the second comparison signal, determining that the period of the clock signal is less than the target range.

17. The monitoring method as defined in claim 16, wherein the oscillator further comprises an oscillation capacitor and the clock signal is generated by charging and discharging the oscillation capacitor with a second current, wherein the step of adjusting the period of the clock signal when the period of the clock signal is not within the target range further comprises:
decreasing the second current to increase the period of the clock signal.

* * * * *